United States Patent [19]

Notthoff et al.

[11] 4,366,377
[45] Dec. 28, 1982

[54] DUAL SENSITIVITY OPTICAL SENSOR

[75] Inventors: Johannes K. Notthoff, Lomita; Rainer Zuleeg, San Juan Capistrano, both of Calif.

[73] Assignee: McDonnell Douglas Corporation, Long Beach, Calif.

[21] Appl. No.: 191,364

[22] Filed: Sep. 29, 1980

[51] Int. Cl.³ .................................................. H01J 40/14
[52] U.S. Cl. .................................. 250/211 J; 250/578; 357/30
[58] Field of Search ............ 250/203 R, 211 R, 211 J, 250/226, 578; 357/29, 30, 32, 13

[56] References Cited

U.S. PATENT DOCUMENTS

| 3,296,502 | 1/1967 | Gross et al. | 250/211 J |
| 3,617,753 | 11/1971 | Kato et al. | 250/211 J |
| 4,003,655 | 1/1977 | Wasilko | 250/203 R |
| 4,129,878 | 12/1978 | Webb | 357/30 |

Primary Examiner—David C. Nelms
Attorney, Agent, or Firm—Gregory A. Cone; George W. Finch; Donald L. Royer

[57] ABSTRACT

A dual sensitivity photodetector comprising a central region comprising a relatively high sensitivity reach through avalanche photo diode and a surrounding region comprising a relatively lower sensitivity P-type intrinsic N-type photodiode is disclosed which possesses the advantages of a wide sensitivity range and a relative freedom from overload.

14 Claims, 6 Drawing Figures

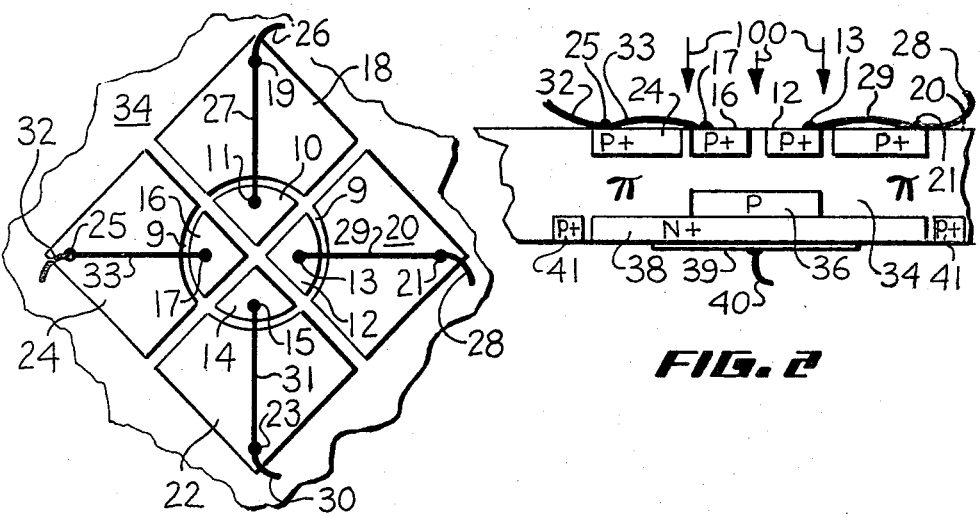
FIG. 1
FIG. 2
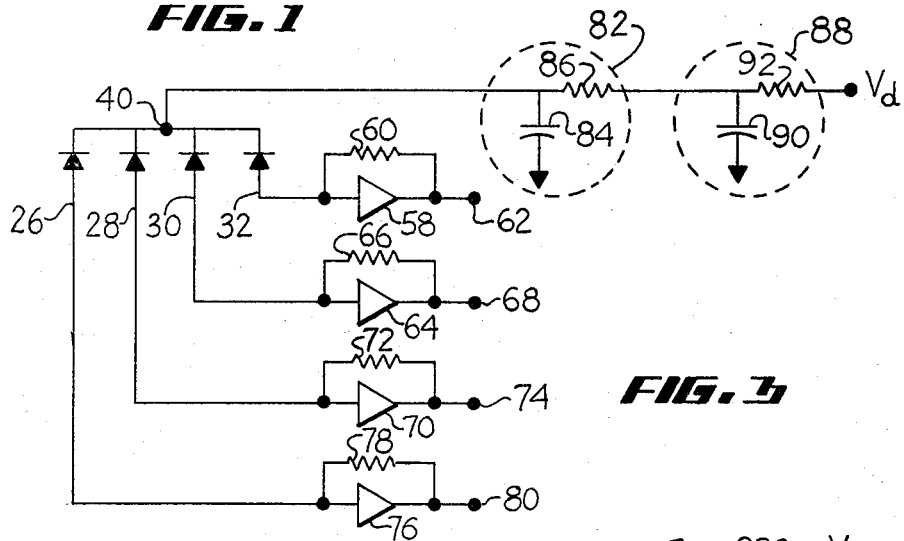
FIG. 3
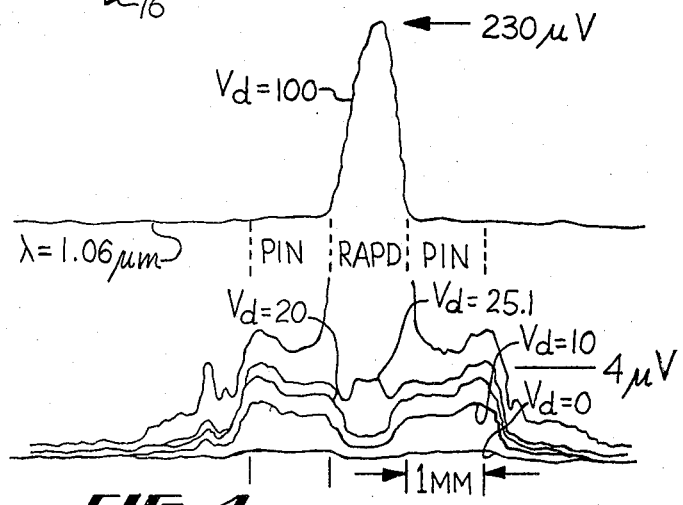
FIG. 4

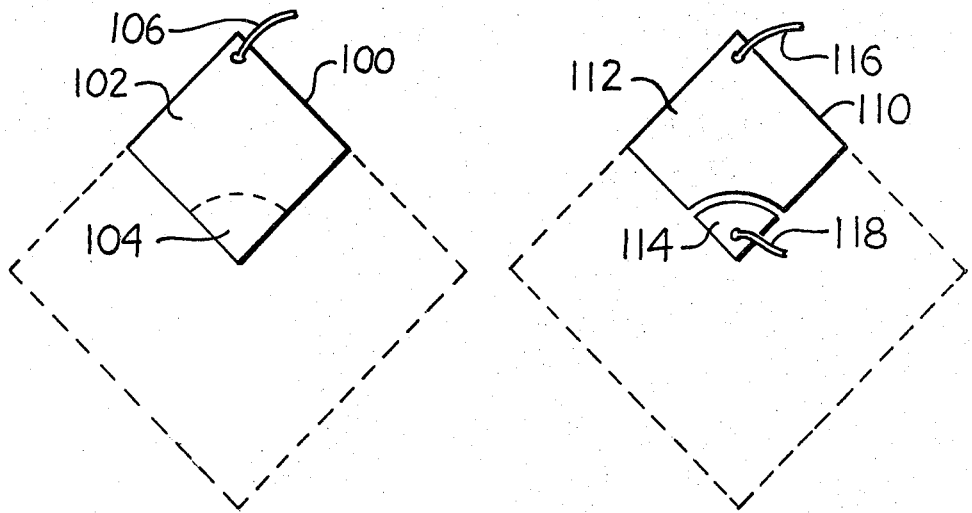

DUAL SENSITIVITY OPTICAL SENSOR

BACKGROUND OF THE INVENTION

1. Field of the Invention

This invention relates to photodetectors. Still more particularly, this invention relates to photoconductors which are composed of two different types of photodiodes.

2. Description of the Prior Art

The class of photodetectors involved herein finds its main usage in optical tracking system applications. The most common photodetector utilized for such applications is a multi-segmented silicon reach through avalanche photodiode (RAPD). A typical such reach through avalanche photodiode will have a three millimeter diameter and be divided into four pie-shaped segments. The photodetector itself is but one component in a larger tracking system comprising a pulsed optical source which impinges upon and is reflected from a target, the reflected echo signal, appropriate receiver optics which form a focused or defocused image on the photodetector, and appropriate control circuits actuated by the signals from the photodetector. The reflected optical pulses impinge upon the photodetector and provide ranging and angular information to the control circuits since any deviation of the target image from bore sight will result in unequal illumination of the four segments of the photodetector. A stronger or weaker signal from one or more quadrants will then energize appropriate control circuits in the device whose orientation is controlled by the tracking system which will then cause the device to re-attain a bore sight tracking attitude in reference to the target.

The diameter of the conventional reach-through avalanche photodiode photodetector device represents an unhappy compromise between two antagonistic constraints. The first is that the diameter of the photodetector must be large enough to accommodate a large target image at close range. The opposing consideration is that, with a conventional RAPD device of a typical three millimeter diameter, large amounts of noise, due to the high sensitivity of the RAPD device, will be introduced into the tracking system; and, at extremely close ranges, the large reflected target image on the device will cause overload of the preamplifier circuits leading into the control circuits for the device.

The conventional large area RAPD device has several disadvantages. In a typical application designed for a three degree field of view, the background noise generated by the large area device will substantially reduce the usable range of the guidance system. Actually, a one degree field of view would be adequate for operations down to ranges of about three kilometers and would produce a target image on the photodetector under 0.5 millimeters in diameter. A one millimeter diameter RAPD device would be adequate at this range, and background noise would be reduced by a factor proportional to the ratio of the different field of views, about three. As mentioned above, another problem arises when the target comes into close range from the seeker. In this case, the reflected signal may be sufficiently large to saturate the RAPD device and/or the associated preamplifier. At these close ranges a reduction in avalanche gain or no avalanche gain is desirable. Another disadvantage for conventional large area RAPD devices is caused by processing constraints. It is quite common that materials and processing tolerance limitations will lead to nonuniform avalanche gain over the area and from segment to segment. The result is that matching of segments, particularly over a wide temperature range, is very difficult.

There are no present photodetector devices that operate satisfactorily over the necessary range of target ranges.

SUMMARY OF THE INVENTION

An integrated photodetector is constructed such that a small central area comprising a high sensitivity photodetector is surrounded by a large area lower sensitivity photodetector. The small central region provides enough area for initial acquisition and tracking. When the reflected image impinging upon the integrated photodetector increases at shorter ranges, the reflected signal is sufficiently large to be detected by the lower sensitivity photodiode.

BRIEF DESCRIPTION OF THE DRAWINGS

FIG. 1 portrays the upper surface of the photodetector;

FIG. 2 is a cross-sectional view of the photodetector;

FIG. 3 is a schematic electrical diagram of one implementation of the photodetector;

FIG. 4 is a graph of the voltage response of the integrated photodetector measured at various points across the width of the device for various different bias voltages;

FIG. 5 is a view of the upper surface of an alternate embodiment of the photodetector, showing one quadrant thereof; and FIG. 6 is a view of the upper surface of yet another embodiment of the photodetector, showing one quadrant thereof.

DETAILED DESCRIPTION OF THE INVENTION

As summarized above, this invention concerns an integrated photodetector comprising a high sensitivity central region surrounded by a lower sensitivity region. The integration of the two different photodetectors with different sensitivities into a single device provides the important advantages of noise reduction and adaptability to the disclosed device over single sensitivity prior art devices.

At present, the most useful high sensitivity photodetector device for utilization as the high sensitivity central region of the integrated photodetector is the reach through avalanche photodiode (RAPD). The RAPD device utilizes avalanche gain to achieve very high sensitivity. The RAPD device is located at the central region of the integrated photodetector in order to utilize its high sensitivity for initial target image acquisition and tracking for the small image sizes, typically less than 0.5 millimeters, encountered at ranges above three kilometers. The diameter of the RAPD region in this particular embodiment is approximately 1.0 millimeters.

The high sensitivity RAPD region is surrounded by a lower sensitivity photodetector region. The PIN (P-type, intrinsic, N-type) photodiode has been advantageously utilized for this purpose. As mentioned above, the lower sensitivity PIN photodetector becomes very useful at the closer target ranges below about three kilometers. As the image size impinging upon the integrated photodetector increases at the shorter ranges, the signal from the photodetector becomes dominated by the signal from the lower sensitivity PIN region and effectively overpowers any detrimental noise contributions from the high sensitivity RAPD central photodiode region. The relative contributions of the signals from the two different regions can be varied by varying the bias voltage across and RAPD region. The total width of the integrated photodetector is approximately three millimeters in this application, with the RAPD device accounting for the central one millimeter, and the PIN region accounting for the remainder of the integrated photodetector.

Most commonly, photodetectors employed for these usages will be multi-segmented. Usually this segmenting will comprise a division of the photodetector into four pie-shaped segments radiating from a central point. As the target image is focused upon the photodetector surface, an off-axis image will produce unequal signals among the four segments. Signals from each of these segments then operate control circuits, which in turn operate positioning devices controlling the alignment of the device guided by the photodetector tracking system. These alignment devices will then act to cause the bore sight axis of the tracking system to align itself with the target image and thereby produce a centrally focused target image upon the photodetector. When the device is again satisfactorily aligned with the target, the photodetector will produce relatively equal signals from each segment of the photodetector.

The structure of one such integrated photodetector can be more completely understood by reference to FIGS. 1 and 2. FIG. 1 shows the upper surface of an integrated photodetector; that is, the surface which receives the radiation from the focused target image. The integrated photodetector is divided into two separate regions: the RAPD high sensitivity region, consisting of the four inner segments 10, 12, 14, and 16; and the outer PIN lower sensitivity region comprising the surrounding four segments 18, 20, 22 and 24.

In this particular photodetector, the inner and outer segments within a given quadrant are connected together. For example, in the upper quadrant, the inner RAPD region 10 is connected by the conductor means 27 to the outer PIN region 18 and from there to the load shown in FIG. 3. Indeed, for this application the segments within the quadrants need not be separated. This embodiment is shown in FIG. 5 which portrays one quadrant 100 of the device with a continuous upper surface accessed by a single conductor 106. The presence of the underlying P region beneath the inner segment of the quadrant 104 is an RAPD region which produces the dual sensitivity of the device. The outer segment of the quadrant 102 is a PIN region. The performance of such a device would be substantially the same as that of the device illustrated in FIGS. 1 and 2.

For other applications, the inner segment and the outer segment in a given quadrant could be independently accessed by separate conductors to separate loads. This embodiment is illustrated in FIG. 6 which shows a single quadrant 110 of the upper surface of the photodetector. This embodiment is similar to that shown in FIGS. 1 and 2 with separated inner 114 and outer 112 segments of the upper surface of the device. However, the two segments are independently accessed by conductors 118 and 116 respectively. Such usage would require eight downstream preamplifiers, one for each of the eight separate segments, instead of the four preamplifiers contemplated in the illustrated photodetector. This particular embodiment has been fabricated in an approximately square outer perimeter configuration; however, other shapes are possible. Regardless of the shapes of the particular regions, what is important is that the response from any given segment in a region be approximately equal to the response from another such segment under equal illumination conditions.

FIG. 2 is a cross-sectional view of the integrated photodetector which shows the internal composition of the semiconductor device. This view is taken through a section line running along the lateral axis of FIG. 1. The construction of the PIN device can be seen going from top to bottom in FIG. 2 from the P+ regions 20 and 24 through the intrinsic layer 34 labeled $\pi$(PI) and down through the N+ region 38 at the bottom of the device. The construction of the central RAPD region is seen in the P+ regions 12 and 16 on the upper surface, the intrinsic layer 34, the P region 36, and the N+ region 38 at the bottom of the device. The P+ guard ring 41 encloses the N+ region 38 in order to minimize current leakage. All the contacts 13, 17, 21, 25, and 39 are normally gold and ohmic in nature. The conductors 29 and 33 join the respective segments within a quadrant, 12 and 20 and 16 and 24 respectively, while another conductor 40 supplies the bias voltage to the device. The impinging radiation 100 strikes the upper surface of the device. Antireflective coatings, not shown, are normally employed to maximize the amount of optical radiation entering the photodetector. A silicon dioxide layer with an appropriate texture is commonly employed for this purpose and should have a thickness of about one quarter of the wavelength of the detected radiation.

FIG. 3 illustrates one circuit implementation of the integrated photodetector. The four quadrants of the integrated photodetector are shown as the four diodes in FIG. 3 which are connected to their respective conductors 26, 28, 30, and 32 on one side and to the bias voltage conductor 40 on the other side. The bias voltage side of the circuit comprises a bias voltage $V_D$ ranging typically from 25 to 250 volts. A noise filter 88 and a protection circuit 82 are disposed between the bias voltage input and the integrated photodetector. The noise filter 88 comprises a resistor 92, typically about 56 kilo ohms, and shunt capacitor 90, typically about 10 nano farads. The protection circuit 82 comprises a resistor 86, typically about 56 kilo ohms, and a shunt capacitor 84, typically about 100 pico farads. On the other side of the circuit, each integrated photodetector quadrant feeds into a transimpedance amplifier. For example, the conductor from the upper quadrant in FIG. 1 feeds into an amplifier 76 with a feedback loop comprising a resistor 78, typically about 20 kilo ohms. The final output from this quadrant 80 would then be connected to further control circuits operating positioning means not shown. Each of the conductors from the remaining three quadrants 28, 30, and 32 would simularly be connected to identical transimpedance amplifier circuits, and thence to their respective downstream control circuits, not shown.

FIG. 4 shows a series of graphs depicting the response of the above-described integrated photodetector. Each graph shows the photo current response of a three millimeter integrated photodetector when scanned with a small spot of IR radiation at a wavelength of 1.06 micrometers. The upper graph shows the full scale response of the integrated device at a bias voltage of 100 volts. It is clear that the response of the central RAPD region completely dominates the response of the integrated device with a peak value of 230 microvolts. The RAPD region has a current responsivity of approximately 7.2 A/W and a gain of approximately 60. The lower series of graphs shows, on a substantially expanded vertical scale, the photocurrent response of the integrated detector for a series of lower bias voltage values: 100 volts, 25.1 volts, 20 volts, 10 volts, and 0 volts. The outer PIN region has a current responsivity of approximately 0.12 A/W. These responsivities are for an optical wavelength of 1.06 micrometers. It is interesting to note that an approximately equal response from the separate regions of the integrated photodetector is produced with a bias voltage of approximately 25 volts. This type of balanced response from the separate regions is particularly useful at close range in many system applications.

The fabrication of these integrated or dual sensitivity photodetector devices is relatively straightforward to one with ordinary skill in the art of semiconductor technology. The total thickness of this particular device is approximately 300 micrometers; however, this particular thickness is not necessarily critical, because the thicknesses of the individual layers within the integrated device can substantially affect the output of the device and, therefore, reduce or increase the total thickness of the device. For example, a relatively thinner device will be able to achieve faster response times, but at the cost of a reduced signal strength, i.e., quantum efficiency. A relatively thicker device will have slower response times, but will produce a stronger signal due to increased quantum efficiency. Also, the depth of the P region 36 shown in FIG. 2 is of particular importance. The depth of the P region 36 is related to the noise performance of the RAPD. In general, a deeper region produces lower noise, because of a lowering of the electric field. On the other hand, the fabrication of deep P regions introduces more non-uniformity in the avalanche gain over large area RAPD's. A compromise has to be established between these two performance characteristics. Other factors are the formation of this avalanche P− region by either diffusion or ion implantation processes. For maintaining low leakage currents, i.e., preserving the lifetime of minority carriers in the $\pi$−region, the low temperature ion implantation is preferred over high temperature diffusion for the formation of this P region.

This integrated photodetector combines two detectors of different responsivity in a single component which can be produced with no additional processing steps. It can provide a combination of small field-of-view high sensitivity detector geometry with a large field-of-view detector of nominal sensitivity. It improves system performance while reducing production costs.

We claim:

1. An integrated dual sensitivity photodetector implemented in a semiconductor material substrate comprising a central region comprising a relatively high sensitivity photodetector device and a surrounding region comprising a relatively lower sensitivity photodector device.

2. The photodetector of claim 1 wherein the photodetectors are photoconductors.

3. The photodetector of claim 1 wherein the central region and the surrounding region are substantially symmetrically arrayed about a central point.

4. The photodetector of claim 2 wherein the relatively high sensitivity photodetector device comprises a reach through avalanche photodiode (RAPD).

5. The photodetector of claim 2 wherein the relatively lower sensitivity photodetector device comprises a P-type, intrinsic, N-type photodiode (PIN).

6. The photodetector of claim 3 wherein the regions are each radially separated into a plurality of segments.

7. The photodetector of claim 6 wherein there are four substantially equal area segments in each region.

8. The photoconductors of claim 2 wherein the photoconductors comprise semiconductors.

9. The semiconductors of claim 8 wherein the semiconductors are implemented with silicon technology.

10. A solid state semiconductor dual sensitivity photodetector device comprising an intrinsic substrate having disposed on a first side a plurality of P+-type radial segments in an inner area substantially symmetrically surrounding a central point surrounded by a further plurality of P+-type radial segments in an outer symmetrically surrounding area, the outer area being isolated from the inner area by a moat, and having disposed on an opposite side of the device a first P-type area located directly opposite to and having substantially the same area as the inner area of the first side and a second N+-type area symmetrically located upon and completely covering the first P-type area, the N+-type area having substantially the same perimeter as the outer perimeter of the symmetrically surrounding outer area on the first side.

11. A solid state semiconductor dual sensitivity photodetector device comprising an intrinsic substrate having disposed on a first side a first P-type area in an inner area substantially symmetrically surrounding a central axis and a second N+-type area symmetrically located upon and completely covering the first P-type area, the effective radius of the N+-type area being greater than about 1.5 times the effective radius of the P-type area, and having disposed on an opposite side of the device a plurality of P+-type radial segments in an area symmetrically surrounding the central axis, the outer perimeter of the P+-type area being substantially the same as the outer perimeter of the N+-type area on the first side.

12. A photodetector circuit comprising:
an integrated dual sensitivity photodetector implemented in a planar semiconductor material comprising a central region comprising a relatively high sensitivity photodiode device and a surrounding region comprising a relatively lower sensitivity photodiode device wherein the central region and the surrounding region are substantially symmetrically arrayed about a central point and the two regions are radially separated into matching segments, and
bias voltage means wherein a bias voltage is applied across the photodetector such that a response to a quantum of illumination by one of the central segments is substantially equal to the response of one of the surrounding region segments for the same quantum of illumination.

13. A photodetector circuit comprising:
a solid state semiconductor dual sensitivity photodiode device comprising an intrinsic substrate having disposed on a first side a plurality of P+-type radial segments in an inner area substantially symmetrically surrounding a central point with the inner area surrounded by a further plurality of P+-type radial segments in an outer symmetrically surrounding area, the outer area being isolated from the inner area by a moat, and having disposed on an opposite side of the device a first P-type area located directly opposite to and having substantially the same area as the inner area of the first side and a second N+-type area symmetrically located upon and completely covering the first P-type area, the N+-type area having substantially the same perimeter as the outer perimeter of the symmetrically surrounding outer area on the first side, and bias voltage means wherein a bias voltage is applied across the photodiode device such that a response to a quantum of illumination by one of the radial segments in the inner area is substantially equal to the response of one of the radial segments of the outer area for the same quantum of illumination.

14. A photodetector circuit comprising:

a solid state semiconductor dual sensitivity photodiode device comprising an intrinsic substrate having disposed on a a first side a first P-type area in an inner area substantially symmetrically surrounding a central axis and a second N+-type area symmetrically located upon and completely covering the first P-type area, the effective radius of the N+-type area being greater than about 1.5 times the effective radius of the P-type area, and having disposed on an opposite side of the device a plurality of P+-type radial segments in an area symmetrically surrounding the central axis, the outer perimeter of the P+-type area being substantially the same as the outer perimeter of the N+-type area on the first side, and bias voltage means wherein a bias voltage is applied across the photodiode device such that a response to a quantum of illumination by one of the radial segments in the inner area is substantially equal to the response of one of the radial segments of the outer area for the same quantum of illumination.

* * * * *